United States Patent
Yoon et al.

(10) Patent No.: US 9,520,377 B2
(45) Date of Patent: Dec. 13, 2016

(54) SEMICONDUCTOR DEVICE PACKAGE INCLUDING BONDING LAYER HAVING $AG_3SN$

(71) Applicant: Samsung Electronics Co., Ltd., Suwon-Si, Gyeonggi-Do (KR)

(72) Inventors: Jeong-Won Yoon, Suwon-si (KR); Baik-woo Lee, Gwangmyeong-si (KR); Seong-woon Booh, Yongin-si (KR); Chang-mo Jeong, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/311,708

(22) Filed: Jun. 23, 2014

(65) Prior Publication Data

US 2015/0115452 A1 Apr. 30, 2015

(30) Foreign Application Priority Data

Oct. 29, 2013 (KR) ........................ 10-2013-0129570

(51) Int. Cl.
*H01L 23/48* (2006.01)
*H01L 23/00* (2006.01)
(Continued)

(52) U.S. Cl.
CPC ............ *H01L 24/29* (2013.01); *B23K 1/0016* (2013.01); *B23K 20/023* (2013.01); *B23K 20/16* (2013.01);
(Continued)

(58) Field of Classification Search
CPC ..... H01L 24/29; B23K 1/0016; B23K 20/023; B23K 20/0244; B23K 20/025; B23K 20/16; B23K 20/233
(Continued)

(56) References Cited

U.S. PATENT DOCUMENTS

2005/0167821 A1* 8/2005 Mamitsu ............... H01L 23/051
257/718
2008/0014460 A1* 1/2008 Riedl ................... B23K 1/0016
428/620
(Continued)

FOREIGN PATENT DOCUMENTS

JP 2011054892 A 3/2011
JP 2012169355 A 9/2012
(Continued)

*Primary Examiner* — Matthew Gordon
(74) *Attorney, Agent, or Firm* — Harness, Dickey & Pierce, P.L.C.

(57) ABSTRACT

Semiconductor device packages and methods of manufacturing the semiconductor device packages are provided. A semiconductor device package may include a bonding layer between a substrate and a semiconductor chip, and the bonding layer may include an intermetallic compound. The intermetallic compound may be a compound of metal and solder material. The intermetallic compound may include $Ag_3Sn$. A method of manufacturing the semiconductor device package may include forming a bonding layer, which bonds a semiconductor chip to a substrate, by using a mixed paste including metal particles and a solder material. The bonding layer may be formed by forming an intermetallic compound, which is formed by heating the mixed paste to react the metal particles with the solder material.

17 Claims, 12 Drawing Sheets

(51) Int. Cl.
  *B23K 1/00* (2006.01)
  *B23K 20/02* (2006.01)
  *B23K 20/16* (2006.01)
  *B23K 20/233* (2006.01)
  *B23K 35/02* (2006.01)

(52) U.S. Cl.
  CPC ........... *B23K 20/233* (2013.01); *B23K 35/025* (2013.01); *B23K 35/0244* (2013.01); *H01L 24/33* (2013.01); *H01L 24/83* (2013.01); *H01L 24/95* (2013.01); *B23K 2201/42* (2013.01); *H01L 2224/293* (2013.01); *H01L 2224/29083* (2013.01); *H01L 2224/29139* (2013.01); *H01L 2224/29339* (2013.01); *H01L 2224/32225* (2013.01); *H01L 2224/32503* (2013.01); *H01L 2224/32507* (2013.01); *H01L 2224/33181* (2013.01); *H01L 2224/8384* (2013.01); *H01L 2224/83091* (2013.01); *H01L 2224/83192* (2013.01); *H01L 2924/13055* (2013.01); *H01L 2924/13091* (2013.01); *H01L 2924/15787* (2013.01)

(58) Field of Classification Search
  USPC ........................................................ 257/762
  See application file for complete search history.

(56) References Cited

U.S. PATENT DOCUMENTS

| | | | |
|---|---|---|---|
| 2012/0061815 A1 | 3/2012 | Sontheimer et al. | |
| 2012/0306105 A1 | 12/2012 | Robert | |
| 2013/0049204 A1* | 2/2013 | Oeschler | H01L 24/29 257/772 |
| 2014/0042603 A1* | 2/2014 | Hosseini | H01L 24/29 257/676 |
| 2014/0062808 A1* | 3/2014 | Kataoka | H01Q 1/32 343/713 |

FOREIGN PATENT DOCUMENTS

| | | |
|---|---|---|
| KR | 20090109159 A | 10/2009 |
| KR | 20130017511 A | 2/2013 |

* cited by examiner

< COMPARATIVE EXAMPLE 1 >

< EXAMPLE EMBODIMENT >

SEMICONDUCTOR DEVICE PACKAGE INCLUDING BONDING LAYER HAVING AG$_3$SN

RELATED APPLICATIONS

This application claims priority under 35 U.S.C. §119 to Korean Patent Application No. 10-2013-0129570, filed on Oct. 29, 2013 in the Korean Intellectual Property Office, the disclosure of which is incorporated herein in its entirety by reference.

BACKGROUND

1. Field

The present disclosure relates to semiconductor device packages and/or methods of manufacturing the same.

2. Description of the Related Art

Power devices control a current flow through on/off switching in various electronic apparatuses and industrial facilities. Generally, the power device is formed of a device, for example, an insulated gate bipolar transistor (IGBT), a metal-oxide-semiconductor field effect transistor (MOSFET), or a diode, which is fabricated based on, for example, silicon (Si), silicon carbide (SiC), or gallium nitride (GaN).

A power device package may be formed by mounting a power device on a substrate and forming an electrical interconnection therebetween. As such, bonding characteristics between the power device (e.g., a semiconductor chip) and the substrate may have a critical influence on performance and reliability of the power device package. In the case that the re-melting temperature of a bonding layer between the power device and the substrate is relatively low, thermo-mechanical reliability and/or long-time reliability may be deteriorated and restrictions on use temperature may occur. In the case where a relatively high pressure process is used in forming the bonding layer, the power device (e.g., semiconductor chip) and the substrate may be damaged due to an applied pressure, thereby causing increase of failure rate and/or deterioration of reliability. In the event that the bonding layer includes pores or cavities, these may act as a crack initiation site or a crack propagation path, thereby causing deterioration of long-time reliability. Further, in the case that the thermal conductivity of the bonding layer is relatively low, it may be difficult to secure desired heat dissipation characteristics.

In a case of designing and manufacturing a semiconductor device package (e.g., a power device package), it is desired to improve characteristics of a bonding portion between a semiconductor chip (e.g., a power device) and a substrate and improve related processes in order to improve performance (e.g., reliability, heat dissipation characteristics, a maximum use temperature). Further, cost reduction and easiness of manufacturing need to be considered.

SUMMARY

Some example embodiments provide semiconductor device packages having high performance and/or high reliability.

Some example embodiments provide semiconductor device packages including a bonding portion having high degree of strength, high thermal conductivity, and/or high re-melting temperature.

Some example embodiments provide semiconductor device packages having excellent long-time reliability and/or excellent thermo-mechanical reliability.

Some example embodiments provide semiconductor device packages having advantages in terms of cost reduction and/or easiness of manufacturing.

Some example embodiments provide semiconductor device packages that can be manufactured without using a relatively high-pressure process.

Some example embodiments provide methods of manufacturing the semiconductor device packages as described herein.

Additional aspects will be set forth in part in the description which follows and, in part, will be apparent from the description, or may be learned by practice of various example embodiments.

According to an example embodiment, a semiconductor device package includes a first substrate, at least one semiconductor chip mounted on the first substrate, a first bonding layer provided between the first substrate and the semiconductor chip, the first bonding layer including Ag$_3$Sn, a metal layer provided between the first bonding layer and the semiconductor chip, the metal layer including a non-solder material, the first bonding layer in contact with the metal layer and the first substrate.

A content of Ag$_3$Sn in the first bonding layer may be equal to or greater than about 90 wt %.

The first bonding layer may include a mixture of Ag and Ag$_3$Sn.

The first bonding layer may include a mixture of Ag, Ag$_3$Sn, and a solder material.

A content of the solder material in the mixture may be equal to or less than about 10 wt %.

A content of Ag$_3$Sn in the first bonding layer may be equal to or greater than about 50 wt %.

The metal layer may include at least one of Al, Cu, Ni, Ag, Au, and an alloy thereof.

The first substrate may be one selected from among a direct bonded copper (DBC) substrate, a direct bonded aluminum (DBA) substrate, a printed circuit board (PCB), and a lead frame.

The semiconductor device package may further include a plurality of semiconductor chips including the at least one semiconductor chip.

The semiconductor device package may further include a base plate attached to the first substrate, and a second bonding layer provided between the base plate and the first substrate, the second bonding layer having a same configuration as the first bonding layer.

The first substrate may be attached to a first surface of the semiconductor chip, and the semiconductor device package may further include a second substrate attached to a second surface of the semiconductor chip, the second surface opposite to the first surface, and a second bonding layer provided between the second substrate and the semiconductor chip, the second bonding layer having a same configuration as the first bonding layer.

The semiconductor device package may further include at least one of a first base plate attached to the first substrate and a second base plate attached to the second substrate.

The at least one semiconductor chip may include at least one power device.

According to an example embodiment, a method of manufacturing a semiconductor device package includes preparing a mixed paste of sinterable metal particles and a solder material, the solder material having a lower temperature than the metal particles, coating the mixed paste on a first substrate; attaching at least one semiconductor chip to the mixed paste coated on the first substrate; and forming a first bonding layer by heating the mixed paste such that the semiconductor chip is bonded to the substrate, wherein the heating of the mixed paste is performed to sinter the metal particles and to form an intermetallic compound by reaction between the metal particles and the solder material.

In the mixed paste, a content ratio of the solder material to the metal particles may be from about 1:3 to about 1:10.

A content of the intermetallic compound in the first bonding layer may be equal to or greater than about 50 wt %.

The metal particles may include Ag.

The solder material may include at least one of an Sn-based solder material, a Pb-based solder material, and an Au-based solder material.

The solder material may include at least one of Sn, Sn—Ag, Sn—Ag—Cu, Sn—Cu, Sn—Pb, and Au—Sn.

The intermetallic compound may include $Ag_3Sn$.

A content of $Ag_3Sn$ in the bonding layer may be equal to or greater than about 90 wt %.

The first bonding layer may include a mixture of Ag and $Ag_3Sn$.

The first bonding layer may include a mixture of Ag, $Ag_3Sn$, and a solder material.

The forming of the bonding layer may be performed by a pressure-less process.

The forming a first bonding layer may include applying a pressure between the first substrate and the semiconductor chip, and the pressure may be equal to or less than about 20 MPa.

The forming a first bonding layer may be performed at a temperature from about 150° C. to about 300° C.

The method may further include providing a metal layer on at least one surface of the semiconductor chip, the metal layer including at least one of Al, Cu, Ni, Ag, Au, and an alloy thereof, wherein the attaching at least one semiconductor chip to the mixed paste may include attaching the metal layer to the mixed paste.

The first substrate may be one selected from among a direct bonded copper (DBC) substrate, a direct bonded aluminum (DBA) substrate, a printed circuit board (PCB), and a lead frame.

The method may further include attaching a plurality of semiconductor chips on the first substrate, the attaching a plurality of semiconductor chips including the attaching at least one semiconductor chip the first substrate.

The method may further include attaching the first substrate to a base plate, and forming a second bonding layer between the base plate and the first substrate, wherein a method of forming the second bonding layer is the same as or similar to the method of forming the first bonding layer.

When the first substrate may be attached to a first surface of the semiconductor chip, the method may further include attaching a second substrate to a second surface of the semiconductor chip, the second surface opposite to the first surface, and forming a second bonding layer between the second substrate and the semiconductor chip, a method of forming the second bonding layer is the same as or similar to the method of forming the first bonding layer.

The at least one semiconductor chip may include at least one power device.

According to an example embodiment, a method of manufacturing a semiconductor device package includes forming a multi-paste layer on a substrate, the multi-paste layer including at least one first paste layer and at least one second paste layer which are alternately stacked on the substrate, attaching a semiconductor chip on the multi-paste layer, and forming a bonding layer such that the semiconductor chip is bonded to the substrate, by heating the multi-paste layer, wherein the at least one first paste layer includes non-solder metal particles, and the at least one second paste layer includes a solder material having a lower melting point than the metal particles.

The multi-paste layer may include a first layer, a second layer, and a third layer, which are sequentially formed on the substrate, wherein the first layer and the third layer correspond to the at least one first paste layer, and the second layer corresponds to the at least one second paste layer.

The first layer and the third layer each may have a thickness greater than the second layer.

The multi-paste layer may include a first layer, a second layer, and a third layer, which are sequentially formed on the substrate, wherein the first layer and the third layer correspond to the at least one second paste layer, and the second layer corresponds to the at least one first paste layer.

The second layer may have a thickness greater than a sum of thicknesses of the first layer and the third layer.

The metal particles may include Ag, and the solder material may include at least one of an Sn-based solder material, a Pb-based solder material, and an Au-based solder material.

The bonding layer may include $Ag_3Sn$, a mixture of Ag and $Ag_3Sn$, or a mixture of Ag, $Ag_3Sn$, and a solder material.

BRIEF DESCRIPTION OF THE DRAWINGS

These and/or other aspects of example embodiments will become apparent and more readily appreciated from the following description of the example embodiments, taken in conjunction with the accompanying drawings in which.

DETAILED DESCRIPTION

Figure 1A:
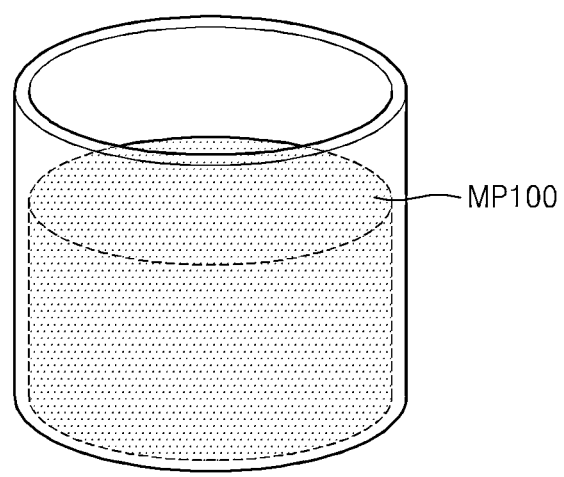
FIGS. 1A through 1D are diagrams illustrating a method of manufacturing a semiconductor device package, according to an example embodiment.

Various example embodiments will now be described more fully with reference to the accompanying drawings in which some example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, an example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to example embodiments, examples of which are illustrated in the accompanying drawings. Widths and thicknesses of layers or regions illustrated in the drawings are exaggerated for clarity. Like reference numerals refer to like elements throughout. Expressions such as "at least one of," when preceding a list of elements, modify the entire list of elements and do not modify the individual elements of the list.

Figure 1B:
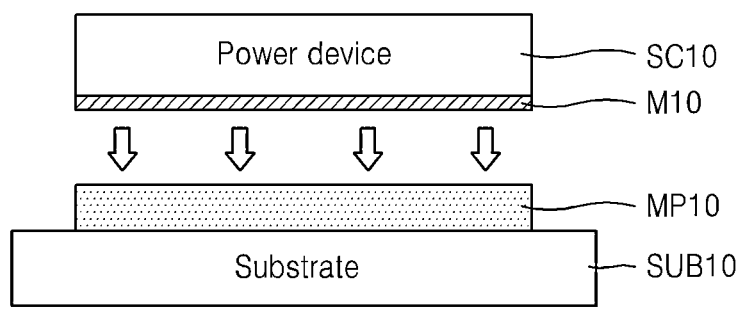
Figure 1C:
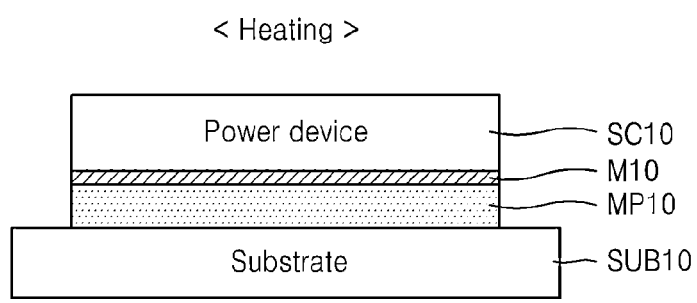
Figure 1D:
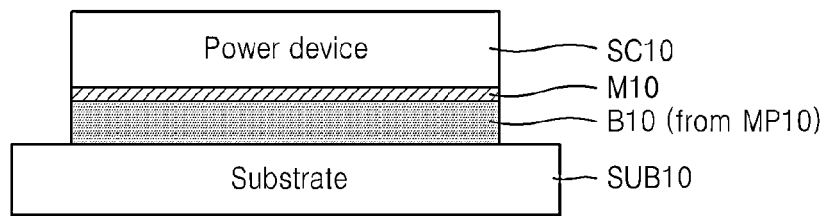

FIGS. 1A through 1D are diagrams illustrating a method of manufacturing a semiconductor device package, according to an example embodiment. FIG. 1A is a perspective view showing the method, and FIGS. 1B through 1D are cross-sectional views illustrating the method.

Referring to FIG. 1A, a mixed paste MP100 may be prepared. The mixed paste MP100 may include sinterable metal particles and a solder material which may be melted at a relatively low temperature compared to the metal particles. The metal particles may be non-solder material. For example, the metal particles may be silver (Ag) particles. The metal particles may be nanoscale or microscale particles. For example, the metal particles each may have a particle diameter in the range of about several nm to about several μm. However, in some cases, the metal particles may have a particle diameter that is greater than 10 μm. The solder material may include, for example, at least one of an Sn-based solder, a Pb-based solder, and an Au-based solder. Examples of the Sn-based solder (lead-free solder) include a pure Sn, Sn—Ag, Sn—Ag—Cu, Sn—Cu, etc. The Pb-based solder (leaded solder) may include, for example, Sn—Pb. The Au-based solder (hard solder) may include, for example, Au—Sn. The solder material may include, for example, Sn as a main component. For example, the Sn content of the solder material may be equal to or greater than about 90 wt %. However, a detailed composition of the solder material and the composition ratio thereof may be variously changed.

In the mixed paste MP100, the content ratio (weight ratio) of the solder material to the metal particles may be equal to or greater than about 1:2.5. For example, in the mixed paste MP100, the content ratio (weight ratio) of the solder material to the metal particles may be about 1:3 to about 1:10. When the content (wt %) of the metal particles is equal to or greater than about 2.5 times or about 3 times the content (wt %) of the solder material, an intermetallic compound may be easily formed due to a reaction therebetween. However, the content ratio of the solder material to the metal particles may be changed according to, for example, a type of the solder material, a type of the metal particles, and/or a type of the intermetallic compound to be formed.

The mixed paste MP100 may be manufactured by mixing a first paste including the metal particles and a second paste including the solder material. Alternatively, the mixed paste MP100 may be manufactured by mixing the metal particles with a paste including the solder material. The metal particles and the solder material may be uniformly or relatively uniformly distributed in the mixed paste MP100. When the metal particles are Ag particles, the mixed paste MP100 may be an "Ag/solder paste". The mixed paste MP100 may further include, for example, a binder and/or a solvent, in addition to the metal particles and the solder material.

Referring to FIG. 1B, a mixed paste layer MP10 may be formed by coating the mixed paste MP100 on a substrate SUB10. For example, the mixed paste layer MP10 may be formed by using, for example, a screen printing method. A mixed paste layer MP10 may have a thickness in the range of about 10 µm to about 100 µm. For example, the thickness of the mixed paste layer MP10 may be about 15 µm to about 30 µm. The substrate SUB10 may be one of various substrates that are used in packaging processes. For example, the substrate SUB10 may be, for example, a direct bonded copper (DBC) substrate, a direct bonded aluminum (DBA) substrate, a printed circuit board (PCB), or a lead frame. The DBC substrate is a substrate in which a Cu layer is attached to both surfaces of a ceramic substrate (e.g., $Al_2O_3$ or AlN substrate), and the DBA substrate is a substrate in which an Al layer is attached to both surfaces of a ceramic substrate. The PCB may include an organic (e.g., plastic) substrate, and the lead frame may be formed of a metal. The material and configuration of the substrate SUB10 are not limited to the above and may be variously modified.

Next, a semiconductor chip SC10 may be attached on the mixed paste layer MP10. It may be referred to as a die-attach process. The semiconductor chip SC10 may be a power device. For example, the semiconductor chip SC10 may be a power device formed of, for example, an insulated gate bipolar transistor (IGBT), a metal-oxide-semiconductor field effect transistor (MOSFET), or a diode, which is based on Si, SiC, GaN, etc. Also, the semiconductor chip SC10 may be a wide band gap (WBG) power device based on SiC, GaN, diamond, or the like. The semiconductor chip SC10 may include a metal layer M10 provided on at least one surface thereof, and the metal layer M10 may be attached to the mixed paste layer MP10. The metal layer M10 may be formed of, for example, a non-solder material. For example, the metal layer M10 may include at least one of Al, Cu, Ni, Ag, Au, and an alloy thereof. In detail, the metal layer M10 may be formed of one of Al, Cu, Ni, and an alloy thereof, and, for example, Cu, Ni, Ag, Au may be coated thereon as a single layer or multiple layers. The metal layer M10 may be referred to as a die back-metal.

Although not illustrated, a metal layer may be provided also on the upper surface of the substrate SUB10, and the mixed paste layer MP10 may be provided on the metal layer. The metal layer may be formed of a material that is the same as or similar to the metal layer M10 of the semiconductor chip SC10. That is, the metal layer (not shown) including at least one of Al, Cu, Ni, Ag, Au, and an alloy thereof may be provided on the upper surface of the substrate SUB10, and the mixed paste layer MP10 may be formed on the metal layer. The metal layer may be regarded as a portion of the substrate SUB10. As such, the substrate SUB10 may be a substrate including the metal layer. If the substrate SUB10 is formed of a metal, the metal layer may not be provided.

Referring to FIG. 1C, a heating process may be performed on the mixed paste layer MP10. The mixed paste layer MP10 may be heated with a temperature higher than the melting point of the solder material of the mixed paste layer MP10 to carry out a sintering process for the metal particles and a soldering process for the solder material at the same time in the mixed paste layer MP10. Through the heating process, the metal particles may be sintered and, at the same time, an intermetallic compound may be formed by a reaction between the metal particles and the solder material. In this manner, in the present example embodiment, the sintering of the metal particles and the soldering of the solder material are simultaneously carried out, and such a process is referred to as a "hybrid bonding" process.

A heating temperature used in the heating process of FIG. 1C may be, for example, from about 150° C. to about 300° C. At such a temperature, a bonding process may be performed without using a pressure. For example, a reaction time for the formation of a final resultant layer (i.e., a bonding layer B10 of FIG. 1D) may vary according to the thickness, composition, and configuration of the mixed paste layer MP10. Further, if necessary, a vacuum soldering and/or a soldering under inactive atmosphere may be performed. A resultant structure of the process of FIG. 1C is illustrated in FIG. 1D.

Referring to FIG. 1D, the bonding layer B10 that bonds the semiconductor chip SC10 to the substrate SUB10 may be formed from the mixed paste layer MP10. The bonding layer B10 may include an intermetallic compound formed by a reaction between the metal particles and the solder material. For example, the intermetallic compound may be $Ag_3Sn$ because when the metal particles are Ag particles and the solder material includes Sn, $Ag_3Sn$ may be formed by a reaction therebetween. The content of the intermetallic compound in the bonding layer B10 may be equal to or greater than about 50 wt %, or may be equal to or greater than about 60 wt %. The intermetallic compound may be uniformly or relatively uniformly distributed in the whole of the bonding layer B10. The thickness of the bonding layer B10 may be in the range of about 10 µm to about 100 µm. For example, the thickness of the bonding layer B10 may be about 15 µm to about 30 µm.

A material composition of the bonding layer B10 formed from the mixed paste layer MP10 may be changed according to the content ratio of the solder material to the metal particles in the mixed paste layer MP10, a process condition, and the like. For example, the bonding layer B10 may be formed of $Ag_3Sn$ in its entirety, or the $Ag_3Sn$ content of the bonding layer B10 may be equal to or greater than about 90 wt %. In other words, an entirety of the bonding layer B10 may be formed of $Ag_3Sn$, or the greater part (90 wt % or more) of the bonding layer B10 may be formed of $Ag_3Sn$. Because $Ag_3Sn$ is formed of three Ag atoms and one Sn atom, the amount of Ag and the amount of Sn (solder) may be adjusted to make the entirety or the greater part of the bonding layer B10 be formed of $Ag_3Sn$. For example, the bonding layer B10 may include a mixture of Ag and $Ag_3Sn$. When the content of Ag is greater than three times the content of Sn in the mixed paste layer MP10, the bonding layer B10 may be formed of the mixture of Ag and $Ag_3Sn$, or the greater part (90 wt % or more) of the bonding layer B10 may be formed of the mixture of Ag and $Ag_3Sn$. For example, the bonding layer B10 may include a mixture of Ag, $Ag_3Sn$, and a solder material. In this case, the content of the solder material in the mixture (Ag+$Ag_3Sn$+solder) may be equal to or less than about 10 wt % or less than about 5 wt %. For example, when a bonding process time is relatively short, some of the solder material may remain without reacting with Ag. The amount of remaining solder material may be relatively very small.

Because the intermetallic compound (e.g., $Ag_3Sn$) is uniformly or relatively uniformly distributed throughout the bonding layer B10, the intermetallic compound may directly contact the metal layer M10. That is, the intermetallic compound may directly contact a non-solder material of the metal layer M10. Also, the intermetallic compound may directly contact the substrate SUB10. The intermetallic compound may directly contact a metal material (e.g., a metal layer) of the substrate SUB10.

During the heating process (shown in FIG. 1C) of forming the intermetallic compound, a reaction between the mixed paste layer MP10 and the metal layer M10 and a reaction between the metal layer M10 and the semiconductor chip SC10 may occur. Further, a reaction between the mixed paste layer MP10 and the substrate SUB10 (or a metal layer (not shown) of the substrate SUB10) may also occur.

Figure 2:
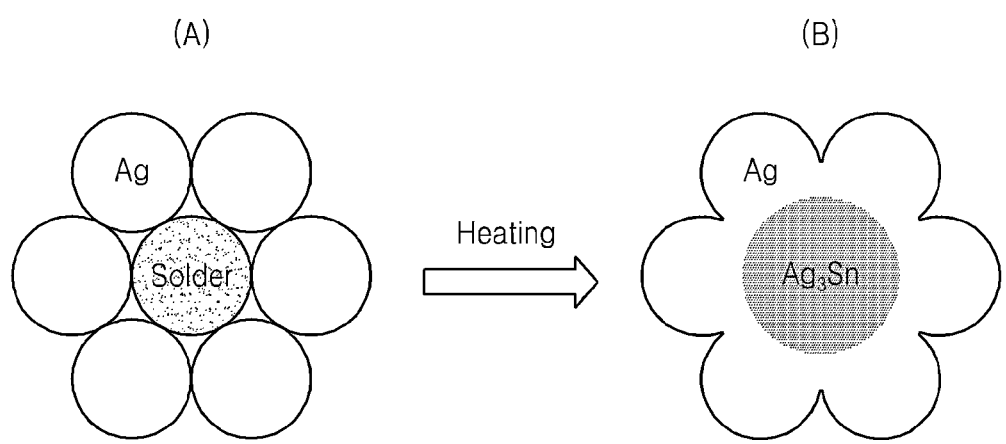
FIG. 2 is a diagram for explaining a mechanism of a hybrid bonding process that is used in a method of manufacturing a semiconductor device package according to an example embodiment.

FIG. 2 is a diagram for explaining a mechanism of a hybrid bonding process that is used in a method of manufacturing a semiconductor device package according to an example embodiment. A diagram (A) of FIG. 2 may correspond to the material of the mixed paste layer MP10 of FIG. 1B, and a diagram (B) of FIG. 2 may correspond to the material of the bonding layer B10 of FIG. 1D.

Referring to FIG. 2, in the hybrid bonding process using Ag particles and a solder material (e.g., Sn or Sn-containing material), a sintering process of the Ag particles and a soldering process of the solder material may simultaneously occur. Because the Ag particles each have a large surface area and a high reactivity, a bonding by the sintering of the Ag particles may partially occur by a heating process. Further, the solder material (e.g., Sn or Sn-containing material) may be melted and permeate into spaces between the Ag particles by a capillary phenomenon and react with the Ag particles. Through such a reaction between the Ag particles and the solder material, $Ag_3Sn$ (e.g., an intermetallic compound) may be formed. The reaction may substantially uniformly occur throughout the mixed paste layer MP10 of FIG. 1B.

Because the Ag particles are partially sintered and the melted solder material reacts with the Ag particles while filling spaces between the Ag particles, a pore or cavity may be prevented or suppressed from being generated. Thus, the bonding layer B10 that is substantially devoid of a pore or cavity may be formed, and a semiconductor device package having high degree of strength and high reliability may be implemented with the bonding layer B10. Because the melted solder material permeates into spaces between the Ag particles by the capillary phenomenon, a sufficient bonding reaction may be induced even if a relatively high pressure is not applied. Thus, damage and reliability deterioration, which may occur due to the relatively high pressure applied in a conventional sintering process, may be prevented. Further, the melting point of pure Ag and the melting point of $Ag_3Sn$ are about 961° C. and about 480° C., respectively, which are relatively high, and thus, the bonding layer B10 formed of such materials may have a relatively high re-melting temperature. Thus, a package including the bonding layer B10 may have improved long-time reliability and thermo-mechanical reliability.

FIG. 2 shows a case in which a mixture of Ag and $Ag_3Sn$ is formed from a paste of the Ag particles and a solder material (e.g., Sn or Sn-containing material). According to another example embodiment, a single material of $Ag_3Sn$ may be formed from a paste of the Ag particles and the solder material (e.g., Sn or Sn-containing material). This example embodiment is illustrated in FIG. 3.

Figure 3:
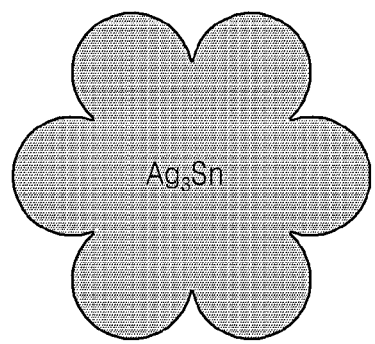
FIG. 3 is a diagram showing an intermetallic compound ($Ag_3Sn$) that may be formed in a method of manufacturing a semiconductor device package according to an example embodiment.

Referring to FIG. 3, a single material of $Ag_3Sn$ may be formed from a paste of the Ag particles and the solder material. The amount of Ag and the amount of Sn in the mixed paste layer MP10 of FIG. 1B may be adjusted to make the entire bonding layer B10 of FIG. 1D be formed of $Ag_3Sn$. For example, the amount of Ag and the amount of Sn may be adjusted to make the greater part of the bonding layer B10 of FIG. 1D be formed of $Ag_3Sn$.

Figure 4:
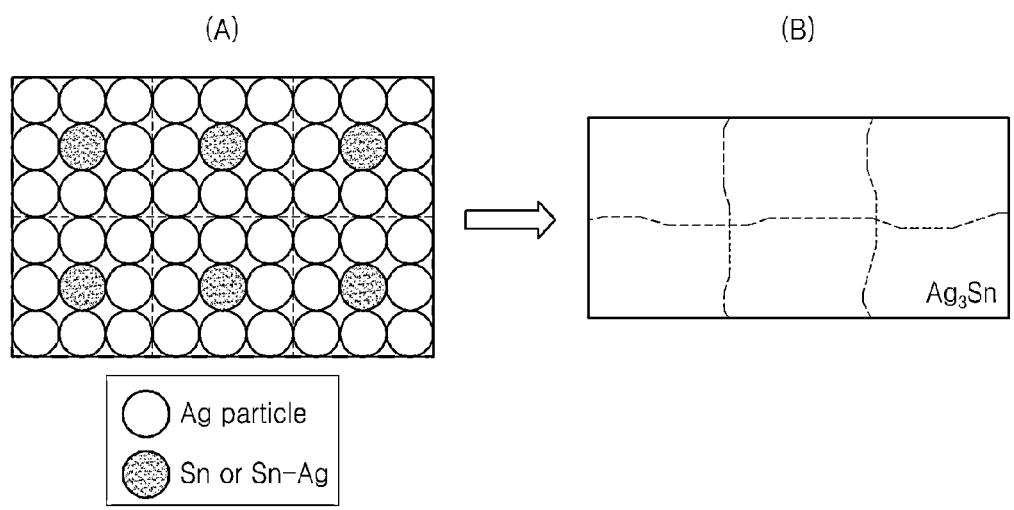
FIGS. 4 and 5 are schematic diagrams showing a hybrid bonding process that may occur in a method of manufacturing a semiconductor device package according to an example embodiment.
Figure 5:
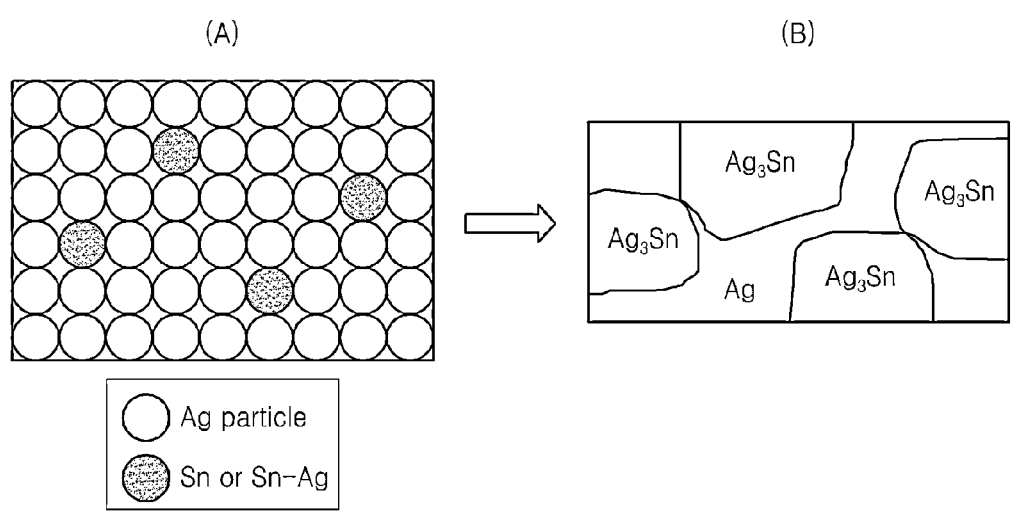

FIGS. 4 and 5 are schematic diagrams showing a hybrid bonding process that may occur in a method of manufacturing a semiconductor device package according to an example embodiment. FIG. 4 illustrates a case in which a single material of $Ag_3Sn$ is formed, and FIG. 5 illustrates a case in which a mixture of Ag and $Ag_3Sn$ is formed. A drawing (A) of FIG. 4 and a drawing (A) of FIG. 5 may correspond to the material of the mixed paste layer MP10 illustrated in FIG. 1B, and a drawing (B) of FIG. 4 and a drawing (B) of FIG. 5 may correspond to the material illustrated in FIG. 1D.

Referring to FIG. 4, when Ag particles and a solder material (Sn or Sn-containing material) are mixed in an appropriate mixture ratio, a single material of $Ag_3Sn$ may be formed through a hybrid bonding process. In the drawing (B) of FIG. 4, $Ag_3Sn$ grains are in contact with each other, and a grain boundary exists between the $Ag_3Sn$ grains. Although eight Ag particles correspond to one solder particle in the drawing (A) of FIG. 4, such a ratio is for the convenience of explanation, and the ratio of Ag particles to solder particles for forming a single material of $Ag_3Sn$ in an actual process may vary.

Referring to FIG. 5, when the amount of the solder material (e.g., Sn or Sn-containing material) is smaller than that of the case of FIG. 4, a mixture of Ag and $Ag_3Sn$ may be formed through the hybrid bonding process. As shown in the drawing (B) of FIG. 5, an Ag material may exist between $Ag_3Sn$ grains. Similar to the drawing (A) of FIG. 4, the ratio of Ag particles to solder particles in the drawing (A) of FIG. 5 is arbitrarily chosen for the convenience of explanation.

Figure 6:
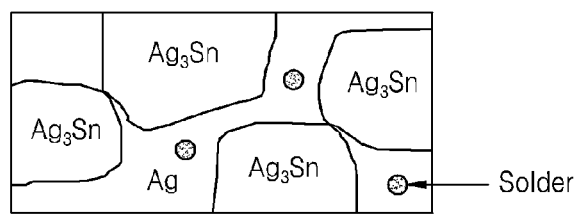
FIG. 6 is a diagram showing a mixture that may be formed in a method of manufacturing a semiconductor device package according to an example embodiment.

If a bonding reaction time is not sufficient, some of the solder material (e.g., Sn or Sn-containing material) may remain without reacting. In this case, finally formed bonding layer may include a mixture of Ag, $Ag_3Sn$, and a remaining solder material. This example embodiment is illustrated in FIG. 6. Referring to FIG. 6, a remaining solder (e.g., Sn or the like) is included in a mixture of Ag and $Ag_3Sn$. The amount of the remaining solder may be relatively very small.

Figure 7:
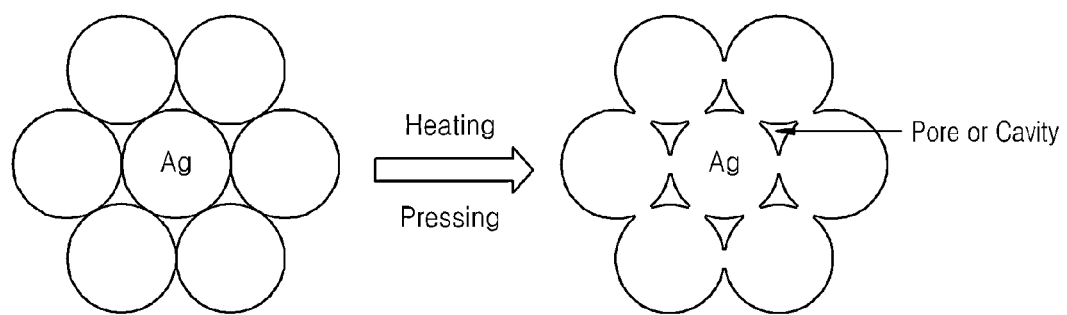
FIG. 7 is a diagram explaining a bonding mechanism that is used in a method of manufacturing a semiconductor device package according to a comparative example (a first comparative example)

FIG. 7 is a diagram for explaining a bonding mechanism that is used in a method of manufacturing a semiconductor device package according to a comparative example (hereinafter, referred to as a first comparative example). FIG. 7 shows a bonding process by a sintering of an Ag paste.

Referring to FIG. 7, when only the Ag paste is used, a sintering process using heat and a relatively high pressure is required, and pores or cavities remain between Ag particles after the sintering. The pores or cavities may act as a crack initiation site or a crack propagation path, thereby causing deterioration of long-time reliability. Further, a semiconductor chip (e.g., a power device) and/or a substrate may be damaged by the relatively high pressure (about 10 MPa to about 30 MPa) applied during the sintering process, thereby increasing a failure rate and deteriorating reliability. In this first comparative example, only a high-priced Ag paste is used, and thus a manufacturing cost is relatively high.

According to some example embodiments, unlike the first comparative example of FIG. 7, pores or cavities may not be generated and a bonding layer may be formed without using a pressure process (i.e., by using a pressure-less process). The pressure-less process refers to a process being conducted in a process pressure at around a normal pressure (e.g., an atmospheric pressure) without specifically adjusting the process pressure substantially above or substantially below the normal pressure (e.g., the atmospheric pressure). Thus, strength of the bonding layer may increase, damage to the semiconductor chip and/or substrate may be minimized or prevented from occurring, and long-time reliability of the semiconductor device package may be improved. Because the relatively high pressure process is not used, a process may be simplified or streamlined. Further, because a mixture of metal particles and a solder material is used, a manufacturing cost may be relatively low compared to that of the first comparative example in which only a relatively expensive Ag paste is used.

Figure 8:
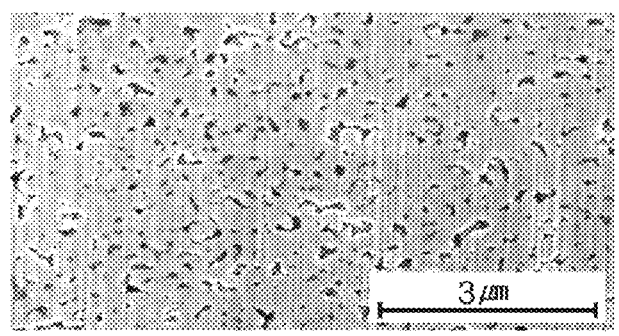
FIG. 8 is a scanning electron microscope (SEM) image obtained by photographing a surface of a bonding layer formed by using the method according to the first comparative example of FIG. 7.

FIG. 8 is a scanning electron microscope (SEM) image obtained by photographing a surface of a bonding layer formed by using the method according to the first comparative example of FIG. 7. Referring to FIG. 8, a large number of pores and cavities is present.

Figure 9:
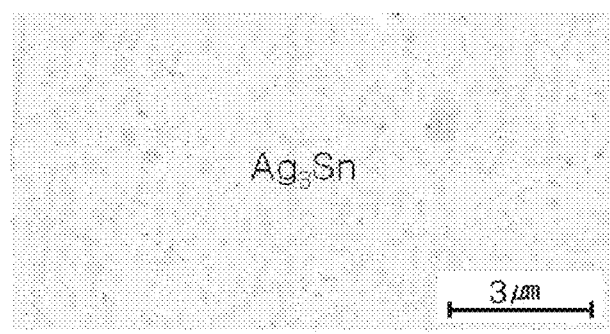
FIG. 9 is a SEM image obtained by photographing a surface of a bonding layer formed by using a method according to an example embodiment.

FIG. 9 is a SEM image obtained by photographing a surface of a bonding layer formed by using a method according to an example embodiment. Referring to FIG. 9, a bonding layer is formed without a pore or a cavity.

In the process of forming a bonding layer according to some example embodiments, a pressure process (e.g., pressure applying process) may be performed to a certain extent. For example, in the process of FIG. 1C, a pressure in addition to heat may be applied to perform the hybrid bonding process. For example, the pressure may be applied between the substrate SUB10 and the semiconductor chip SC10, and may be lower than the pressure applied in the first comparative example of FIG. 7. For example, the pressure applied in the above example embodiments may be a pressure lower than about 30 MPa, or a pressure lower than about 20 MPa. When such a relatively low pressure process is used, damages of the semiconductor chip SC10 and/or substrate SUB10 may be prevented or suppressed. Further, the relatively lower pressure process may be advantageous for forming a uniform bonding layer B10. In the above example embodiments, the heat and the relatively low pressure may be simultaneously applied, or the heat may be applied after first applying the relatively low pressure. Further, the heat and the relatively low pressure may be applied in multiple steps.

Figure 10:
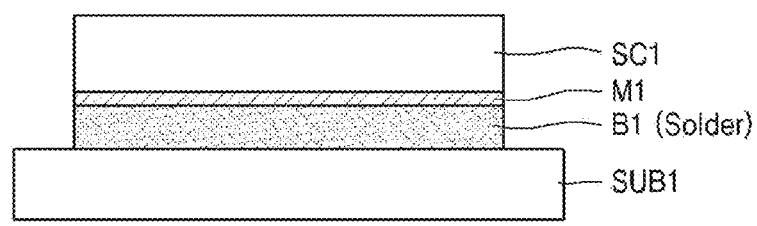
FIG. 10 is a cross-sectional view showing a semiconductor device package including a bonding layer according to another comparative example (a second comparative example)

FIG. 10 is a cross-sectional view showing a semiconductor device package including a bonding layer according to another comparative example (hereinafter, referred to as a second comparative example). In the second comparative example, a bonding layer B1 is formed through a soldering process of a solder paste.

Referring to FIG. 10, the semiconductor device package according to the second comparative example includes a solder layer formed through the soldering of the solder paste as the bonding layer B1. In the second comparative example, the solder paste is melted and reacted with metals of both bonding targets to form a compound at bonding interfaces, and thus the both bonding targets are bonded to each other.

In this second comparative example, the entire bonding layer B1 or the greater part of the bonding layer B1 is a solder alloy. Re-melting temperature of the bonding layer B1 may be relatively low. For example, when the bonding layer B1 is formed of an Sn—Ag solder alloy, the re-melting temperature of the bonding layer B1 may be about 221° C. Thus, thermo-mechanical reliability and long-time reliability of a package including the bonding layer B1 formed by soldering may be deteriorated with relative ease. Because the package according to this second comparative example may not be used at a temperature greater than about 220° C. and may be typically used only at a temperature less than about 150° C. Thus, there are restrictions on a use temperature tolerable by the semiconductor device package of the second comparative example. Reference numerals SUB1, M1, and SC1 of FIG. 10 denote a substrate, a metal layer, and a semiconductor chip, respectively.

Figure 11:
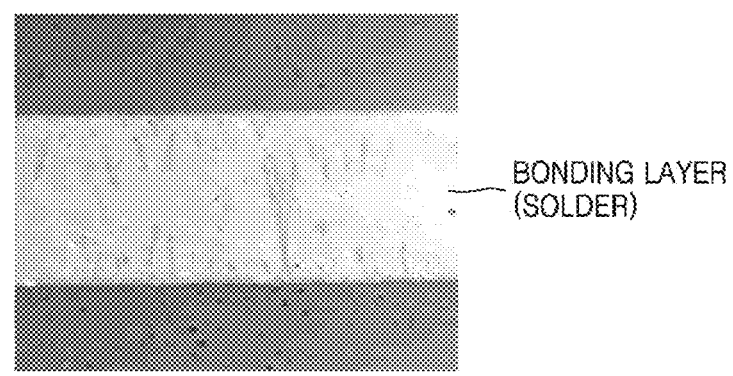
FIG. 11 is a SEM image showing a portion of a semiconductor device package using a solder layer of FIG. 10 as a bonding layer.

FIG. 11 is a SEM image showing a portion of a semiconductor device package using the solder layer of FIG. 10 as a bonding layer. The bonding layer (e.g., the solder layer) of FIG. 11 is an Sn—Ag alloy layer.

According to some example embodiments, unlike the second comparative example as shown in FIGS. 10 and 11, a package including a bonding layer (B10 of FIG. 1D) having a high re-melting temperature may be achieved. For example, the re-melting temperature of $Ag_3Sn$ (melting point of which is about 480° C.) or Ag (melting point of which is about 961° C.) of the bonding layer B10 may be far higher than that of the bonding layer B1 according to the second comparative example of FIGS. 10 and 11. Thus, according to some example embodiments, a package having improved thermo-mechanical reliability and improved long-time reliability may be implemented. In particular, a packaging technology capable of enduring a high temperature is desired in a wide band gap (WBG) power device based on, for example, SiC, GaN, or diamond, which is expected to be widely used in the future to implement high power modules. The hybrid bonding technology according example embodiments may be useful in such power devices and high power modules. Further, compared to a solder bonding portion (i.e., the bonding layer B1 of FIG. 10), the bonding layer B10 according to example embodiments may have improved mechanical bonding strength and high thermal conductivity. Thus, the strength of the semiconductor device package and the heat dissipation performance of the semiconductor device package may be improved.

According to another example embodiment, a plurality of semiconductor chips may be mounted on a substrate. An example of this case is illustrated in FIGS. 12A and 12B.

Figure 12A:
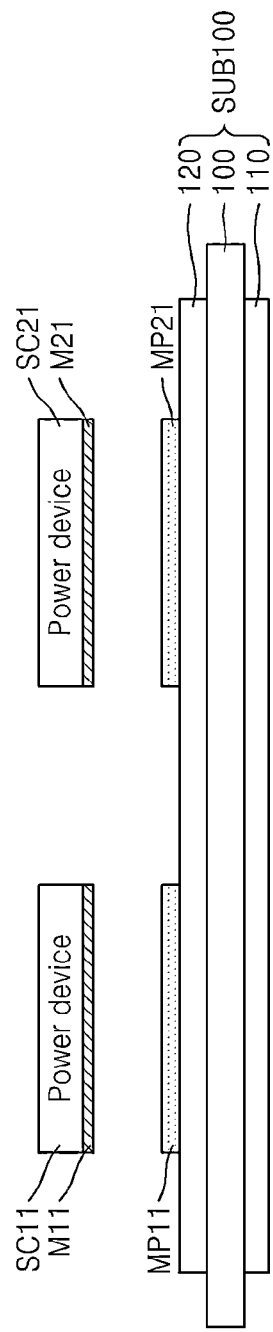
FIGS. 12A and 12B are cross-sectional views illustrating a method of manufacturing a semiconductor device package, according to another example embodiment.
Figure 12B:
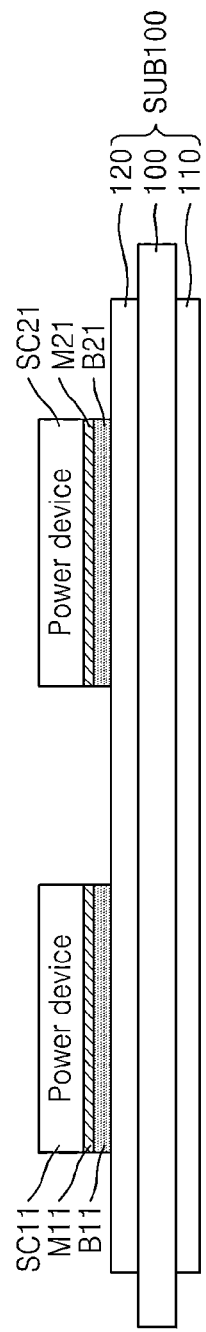

FIGS. 12A and 12B are cross-sectional views illustrating a method of manufacturing a semiconductor device package, according to another example embodiment.

Referring to FIG. 12A, a plurality of semiconductor chips (e.g., a first semiconductor chip SC11 and a second semiconductor chip SC21) may be attached on a substrate SUB100. The substrate SUB100 may be, for example, a direct bonded copper (DBC) substrate, a direct bonded aluminum (DBA) substrate, a printed circuit board (PCB), or a lead frame. For example, the substrate SUB100 may be the DBC substrate. In this case, the substrate SUB100 may include a ceramic substrate 100 and first and second Cu layers 110 and 120 provided on both surfaces of the ceramic substrate 100. The ceramic substrate 100 may be formed of, for example, $Al_2O_3$, or AlN. At least one of the first and second Cu layers 110 and 120 may have a patterned structure. When the first and second Cu layers 110 and 120 are replaced with Al layers, the substrate SUB100 may be a DBA substrate. First and second mixed paste layers MP11 and MP21 may be formed on the second Cu layer 120. The first and second mixed paste layers MP11 and MP21 may be the same as or similar to the mixed paste layer MP10 of FIG. 1B. Thus, the first and second mixed paste layers MP11 and MP21 may be formed of a paste which includes sinterable metal particles and a solder material which can be melted at a relatively low temperature compared to the metal particles.

The first and second semiconductor chips SC11 and SC21 may be power devices. The first and second semiconductor chips SC11 and SC21 may be different power devices. For example, the first semiconductor chip SC11 may be a power device including one selected from among an IGBT, a MOSFET, and a diode, and the second semiconductor chip SC21 may be a power device including another one selected from among the IGBT, the MOSFET, and the diode. For example, the first semiconductor chip SC11 may be a power device including the IGBT, and the second semiconductor chip SC21 may be a power device including the diode. However, in some cases, the first and second semiconductor chips SC11 and SC21 may be power devices of a same type.

A first metal layer M11 may be provided on the lower surface of the first semiconductor chip SC11, and a second metal layer M12 may be provided on the lower surface of the second semiconductor chip SC21. Each of the first and second metal layers M11 and M21 may be formed of a non-solder material. For example, each of the first and second metal layers M11 and M12 may include at least one of Al, Cu, Ni, Ag, Au, and an alloy thereof. For example, each of the first and second metal layers M11 and M12 may be formed of, for example, at least one of Al, Cu, Ni, and an alloy thereof and at least one of Cu, Ni, Ag and Au coated thereon as a single layer or multiple layers. The first and second metal layers M11 and M12 may be attached to the first and second mixed paste layers MP11 and MP21, respectively.

Referring to FIG. 12B, first and second bonding layers B11 and B21 may be formed from the first and second mixed paste layers MP11 and MP21, respectively, through a process that is the same as or similar to that of FIG. 1C. Each of the first and second bonding layers B11 and B21 may have a configuration that is the same as or similar to that of the bonding layer B10 of FIG. 1D. For example, each of the first and second bonding layers B11 and B21 may be formed of a single material of $Ag_3Sn$, may include $Ag_3Sn$ as a main material, or may include a mixture of Ag and $Ag_3Sn$ or a mixture of Ag, $Ag_3Sn$, and a solder material.

Figure 13:
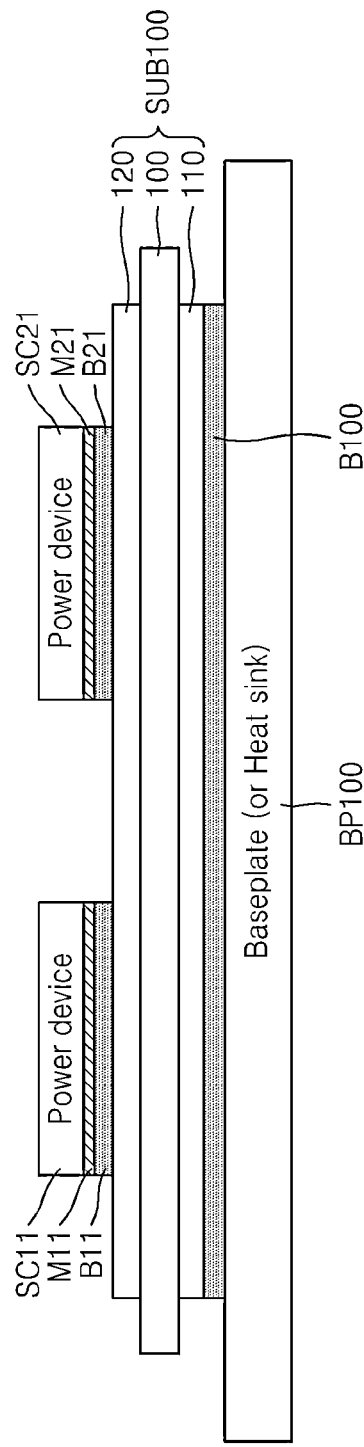
FIGS. 13 through 15 are cross-sectional views showing semiconductor device packages, according to other example embodiments.

The semiconductor device package of FIG. 12B may be attached to a base plate, as illustrated in FIG. 13.

Referring to FIG. 13, the structure of FIG. 12B may be bonded to a base plate BP100. The lower surface of the substrate SUB100 may be bonded to the base plate BP100. The substrate SUB100 and the base plate BP100 may be bonded to each other by using a bonding layer B100 (hereinafter, referred to as a lower bonding layer). The lower bonding layer B100 may be formed by using a method that is the same as the method of forming the bonding layer B10, described with respect to FIGS. 1A through 1D. Thus, the lower bonding layer B100 may have a configuration that is the same as or similar to those of the first and second bonding layers B11 and B21. The first and second bonding layers B11 and B21 and the lower bonding layer B100 may be sequentially or simultaneously formed. The base plate BP100 may include, for example, Al, AlSiC, Cu, CuW, CuMo, $Si_3N_4$, Ni, or an alloy thereof. Also, the base plate BP100 may include various plating layers. The base plate BP100 may be a heat sink. Further, a heat sink having a form that is different from that of the base plate BP100 may be attached on the lower surface of the substrate SUB100.

Figure 14:
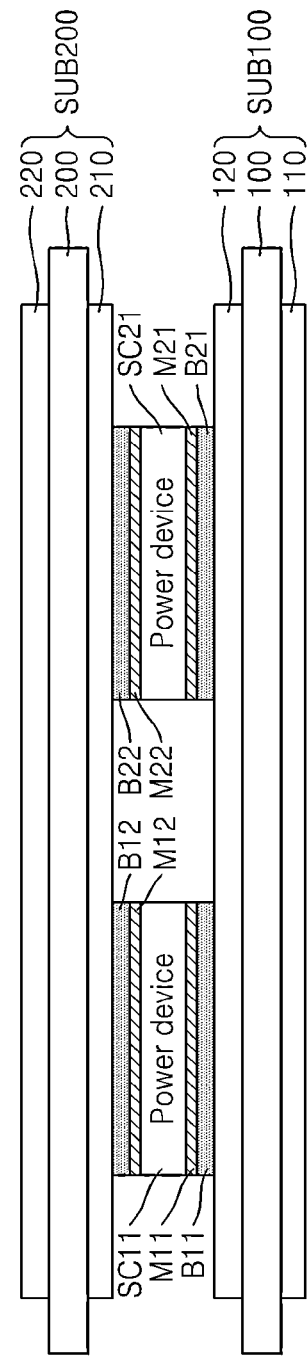

FIG. 14 is a cross-sectional view illustrating a method of manufacturing a semiconductor device package, according to another example embodiment. This example embodiment shows an example of a semiconductor device module capable of performing dual-side cooling.

Referring to FIG. 14, a second substrate SUB200 may be attached on the upper side of the structure of FIG. 12B. For example, the second substrate SUB200 may be a DBC substrate, a DBA substrate, a PCB substrate, or a lead frame. When the second substrate SUB200 is the DBC substrate, the second substrate SUB200 may include a second ceramic substrate 200 and third and fourth Cu layers 210 and 220 provided on both surfaces of the second ceramic substrate 200. First and second semiconductor chips SC11 and SC21 may be bonded to the second substrate SUB200 by the third and fourth bonding layers B12 and B22, respectively. The third and fourth bonding layers B12 and B22 may be formed by using the same method as illustrated above to form the first and second bonding layers B11 and B21. The first and second bonding layers B11 and B21 and the third and fourth bonding layers B12 and B22 may be sequentially or simultaneously formed. A third metal layer M12 may be provided between the first semiconductor chip SC11 and the third bonding layer B12. A fourth metal layer M22 may be provided between the second semiconductor chip SC21 and the fourth bonding layer B22. The third and fourth metal layers M12 and M22 may be the same as or similar to the first and second metal layers M11 and M21.

Figure 15:
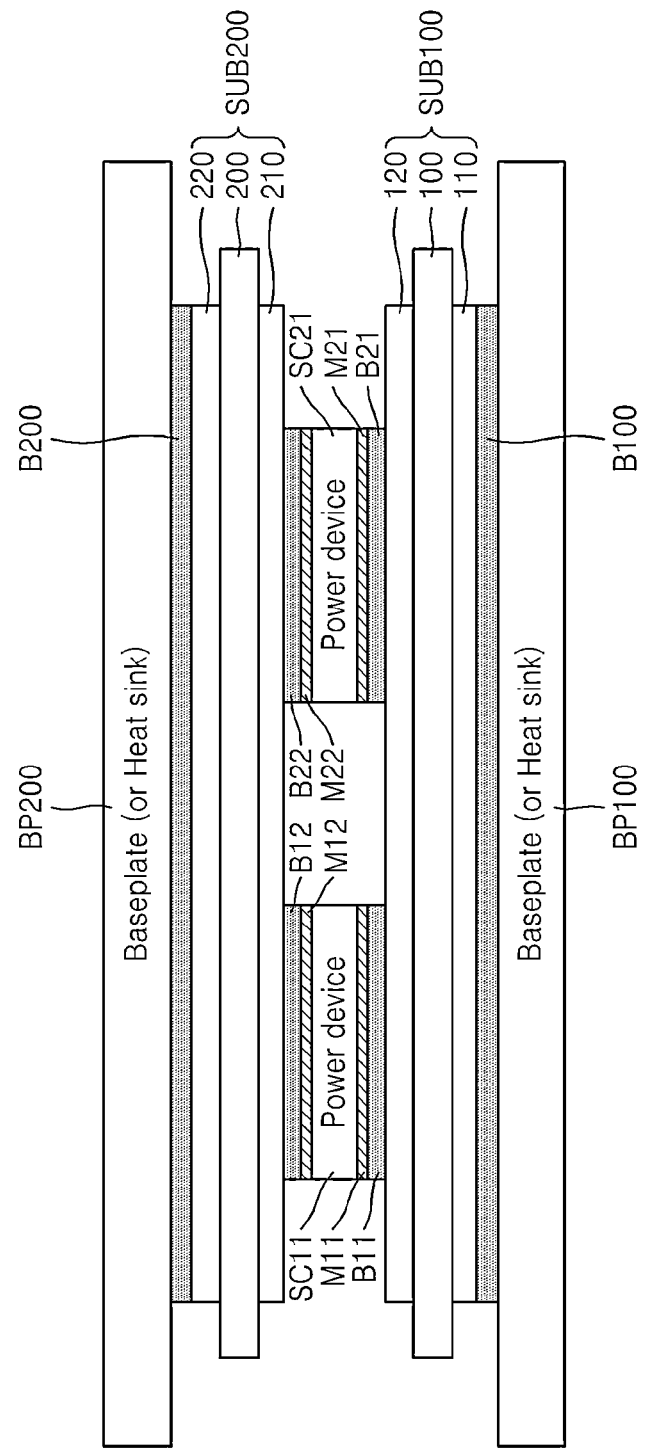

A base plate or a heat sink may be bonded to one surface or both surfaces of the structure of FIG. 14. FIG. 15 shows an example in which first and second base plate BP100 and BP200 are bonded to both surfaces of the structure of FIG. 14, respectively.

Referring to FIG. 15, the first base plate BP100 may be bonded to the lower surface of the first substrate SUB100, and the second base plate BP200 may be bonded to the upper surface of the second substrate SUB200. The first substrate SUB100 and the first base plate BP100 may be bonded to each other by a bonding layer B100 (hereinafter, referred to as a lower bonding layer). The second substrate SUB200 and the second base plate BP200 may be bonded to each other by a bonding layer B200 (hereinafter, referred to as an upper bonding layer). The lower bonding layer B100 and the upper bonding layer B200 may be formed by using a method that is the same as or similar to the method of forming the bonding layer B10, described with respect to FIGS. 1A through 1D. Thus, the lower bonding layer B100 and the upper bonding layer B200 may have a configuration that is the same as or similar to those of the first through fourth bonding layers B11, B21, B12, and B22. At least one of the first and second base plate BP100 and BP200 may be a heat sink. Alternatively, at least one of the first and second base plate BP100 and BP200 may be replaced with a heat sink having a different structure.

When the first and second semiconductor chips SC11 and SC12 in the package structures of FIG. 12B and FIGS. 13 through 15 are power devices, the package structures may be referred to as a kind of "power module".

Although bonding layers formed by using a paste layer obtained by mixing metal particles and a solder material have been explained, the bonding layer may be formed by using a paste layer having a multi-layered structure, according to some example embodiments as illustrated in FIGS. 16A and 16B and FIGS. 17A and 17B.

Figure 16A:
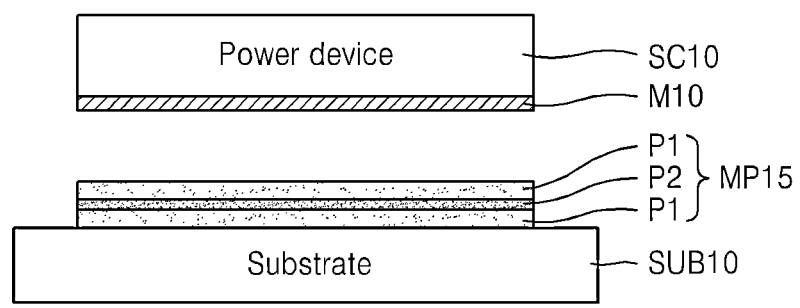
FIGS. 16A and 16B are cross-sectional views illustrating a method of manufacturing a semiconductor device package, according to another example embodiment.
Figure 16B:
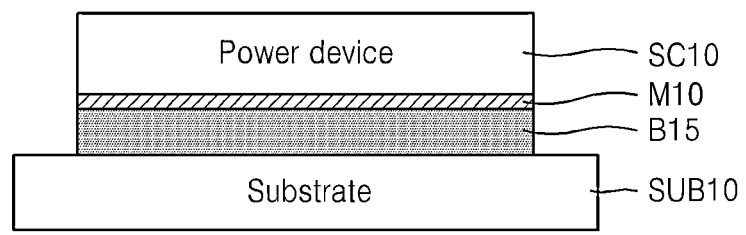

FIGS. 16A and 16B are cross-sectional views illustrating a method of manufacturing a semiconductor device package, according to another example embodiment.

Referring to FIG. 16A, a paste layer MP15 (hereinafter, referred to a multi-paste layer) having a multi-layered structure may be formed on a substrate SUB10. The multi-paste layer MP15 may have a structure in which at least one first paste layer P1 and at least one second paste layer P2 are alternately stacked. The first paste layer P1 may include metal particles that are non-solder material, and the second paste layer P2 may include a solder material whose melting point is lower than that of the metal particles. Metal particles of the first paste layer P1 may correspond to the metal particles of the mixed paste MP100 of FIG. 1A, and a solder material of the second paste layer P2 may correspond to the solder material of the mixed paste MP100 of FIG. 1A. For example, the first paste layer P1 may include Ag particles, and the second paste layer P2 may include at least one of an Sn-based solder material, a Pb-based solder material, and an Au-based solder material. In the present example embodiment, the multi-paste layer MP15 may have a structure in which the second paste layer P2 is disposed between two first paste layers P1. For example, the multi-paste layer MP15 may include one first paste layer (i.e., a lower first paste layer) P1, one second paste layer P2, and another first paste layer (i.e., an upper first paste layer) P1, which are sequentially stacked on the substrate SUB10. For example, each of the two first paste layers P1 may have a thickness that is greater than that of the second paste layer P2. For example, each of the two first paste layers P1 may have a thickness equal to or greater than about 1.5 times the thickness of the second paste layer P2. When each of the two first paste layer P1 has a thickness larger than that of the second paste layer P2, an intermetallic compound may be easily formed therefrom. However, appropriate thicknesses of the first and second paste layers P1 and P2 may vary according to types of materials of the first and second paste layers P1 and P2 and a type of the intermetallic compound to be formed.

Referring to FIG. 16B, a heating process may be performed to form a bonding layer B15 by which a semiconductor chip SC10 is attached to the multi-paste layer MP15. The solder material of the second paste layer P2 may be melted during the heating (e.g., bonding) process, the melted solder material may permeate into the first paste layer P1 disposed at both sides of the second paste layer P2, and a reaction as described with reference to FIGS. 2 and 3 may occur. Thus, the bonding layer B15 may have a configuration that is the same as or similar to that of the bonding layer B10 of FIG. 1D.

In addition to the heating process, a pressure process may be performed. That is, both pressure and heat may be applied to perform a bonding process. For example, the pressure may be a pressure lower than about 30 MPa or a pressure lower than about 20 MPa. The heat and the relatively low pressure may be simultaneously applied, or the heat may be applied after first applying the relatively low pressure. For example, the heat and the relatively low pressure may be applied in multiple steps.

Figure 17A:
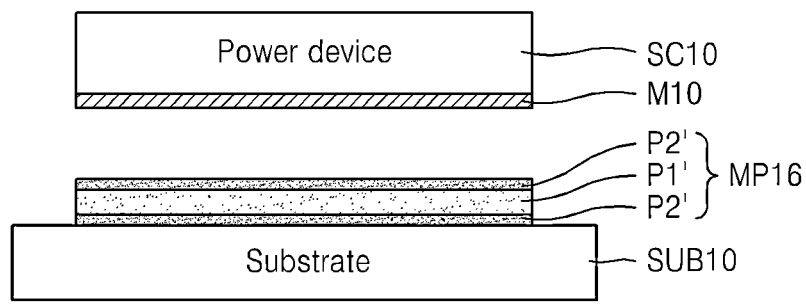
FIGS. 17A and 17B are cross-sectional views illustrating a method of manufacturing a semiconductor device package, according to still another example embodiment.
Figure 17B:
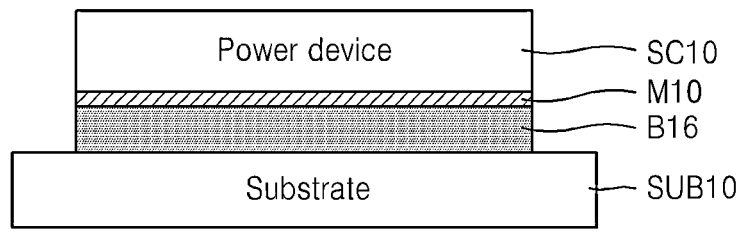

FIGS. 17A and 17B are cross-sectional views illustrating a method of manufacturing a semiconductor device package, according to still another example embodiment.

Referring to FIG. 17A, a paste layer MP16 (hereinafter, referred to a multi-paste layer) having a multi-layered structure may be formed on a substrate SUB10. The multi-paste layer MP16 may have a structure in which a first paste layer P1' is disposed between two second paste layers P2'. That is, the multi-paste layer MP16 may include one second paste layer (i.e., a lower second paste layer) P2', one first paste layer P1', and another second paste layer (i.e., an upper second paste layer) P2', which are sequentially stacked on the substrate SUB10. The first paste layer P1' may include metal particles, and may be formed of the same material as the first paste layer P1 of FIG. 16A. The second paste layer P2' may include a solder material, and may be formed of the same material as the second paste layer P2 of FIG. 16A. The first paste layer P1' may have a thickness that is greater than a sum of thicknesses of the two second paste layers P2'. For example, the first paste layer P1' may have a thickness that is equal to or greater than about three times the thickness of the sum of the two second paste layers P2'. When the first paste layer P1' has a thickness that is larger than the sum of thicknesses of the two second paste layers P2', an intermetallic compound may be easily formed. However, appropriate thicknesses of the first and second paste layers P1' and P2' may vary according to types of materials of the first and second paste layers P1' and P2' and a type of the intermetallic compound to be formed.

Referring to FIG. 17B, a heating process may be performed to form a bonding layer B16 by which a semiconductor chip SC10 is attached to the multi-paste layer MP16. The solder material of the two second paste layers P2' may be melted in the heating process (e.g., bonding process), the melted solder material may permeate into the first paste layer P1' disposed between the two second paste layers P2', and a reaction as described with reference to FIGS. 2 and 3 may occur. Thus, the bonding layer B16 may have a configuration that is the same as or similar to that of the bonding layer B10 of FIG. 1D. In addition to the heating process, a relatively low pressure process may be performed. The relatively low pressure process may be the same as or similar to that described with reference to FIGS. 16A and 16B.

Although the multi-paste layer MP15 or MP16 having a three-layer structure are used in FIGS. 16A and 16B and FIGS. 17A and 17B, a multi-paste layer having a two-layer structure or a four or more-layer structure may be used to form the bonding layer B15 or B16. For example, the upper first paste layer P1 illustrated in FIG. 16A may be excluded from the multi-paste layer MP15 of FIG. 16A to perform the bonding process, and the upper second paste layer P2' illustrated in FIG. 17A may be excluded from the multi-paste layer MP16 of FIG. 17A to perform the bonding process. When a multi-paste layer having a two-layer structure is used, the thickness of a first paste layer including metal particles may be larger than that of a second paste layer including a solder material. For example, the thickness of the first paste layer including the metal particles may be equal to or greater than about three times the thickness of the second paste layer including the solder material. However, the ratio of the thickness of the first paste layer to the thickness of the second paste layer may vary.

Although the above descriptions of FIGS. 1A through 1D, FIGS. 2 through 6, and FIGS. 12A through 17B describes the cases where the Ag particles are used as the sinterable metal particles, metal particles other than the Ag particles may be used as the sinterable metal particles. That is, metal particles that may be sintered and has a melting point higher than that of the solder material may be applied to some example embodiments. For example, particles, for example, Al particles, Fe particles, Cu particles, Ni particles, or Au particles may be used as the metal particles. If the Cu particles are used as the metal particles, $Cu_6Sn_5$ may be formed as an intermetallic compound. In this case, the entire or the greater part of the bonding layer may be formed of Cu₆Sn₅, or may include a mixture of Cu and Cu₆Sn₅, or a mixture of Cu, Cu₆Sn₅, and a solder material. If the Ni particles are used as the metal particles, $Ni_3Sn_4$ may be formed as an intermetallic compound. In this case, the entire or the greater part of the bonding layer may be formed of $Ni_3Sn_4$, or may include a mixture of Ni and $Ni_3Sn_4$, or a mixture of Ni, $Ni_3Sn_4$, and a solder material.

The method of manufacturing a semiconductor device package according to one of example embodiments and the semiconductor device package manufactured by using the method may be applied to, for example, a discrete power package, a power module, and an intelligent power module (IPM), which are formed of a power device (e.g., IGBT, MOSFET, or diode). The method and the semiconductor device package may be applied to a WBG power device based on, for example, SiC, GaN, or diamond as well as a Si-based power device. Examples of main application fields of the discrete power package, power module, and IPM includes, for example, a converter, an inverter, a power supply, an uninterruptible power supply (UPS), information technology (IT) & consumer electronics, automotive electronics, a photovoltaic device, a wind turbine, a transportation system, and a power distribution apparatus. Other examples of application fields includes various electronic components used in, for example, consumer electronics (e.g., home appliances), and automotive electronics (e.g., electric vehicles (EVs) or hybrid electric vehicles (HEVs)). The method and the semiconductor device package may be applied to various electronic devices and various circuit apparatuses other than power device packages and power modules.

It should be understood that some example embodiments described therein should be considered in a descriptive sense only and not for purposes of limitation. For example, it will be understood by those of ordinary skill in the art that the structures of the semiconductor device package and the method of manufacturing the semiconductor device package, illustrated in FIGS. 1A through 1D, FIGS. 2 through 6, or FIGS. 12A through 17B, may vary. Further, it will be understood by those of ordinary skill in the art that the material, thickness, composition ratio, form of the paste layer and the material, thickness, composition ratio, form of the bonding layer may vary and the configuration of the semiconductor chip and the configuration of the substrate may also vary. Furthermore, the semiconductor device package may be variously applied to various semiconductor devices in addition to a power device, a power system, and a power module.

While some example embodiments have been described with reference to the figures, it will be understood by those of ordinary skill in the art that various changes in form and details may be made therein without departing from the spirit and scope of the present disclosure as defined by the following claims.

What is claimed is:

1. A semiconductor device package comprising:
   a first substrate;
   at least one semiconductor chip mounted on the first substrate;
   a first bonding layer provided between the first substrate and the semiconductor chip, the first bonding layer including $Ag_3Sn$ grains; and
   a metal layer provided between the first bonding layer and the semiconductor chip, the metal layer including a non-solder material, the first bonding layer in contact with the metal layer and the first substrate,
   wherein the first bonding layer is substantially devoid of pores,
   wherein the $Ag_3Sn$ grains are substantially uniformly distributed throughout the first bonding layer, and the $Ag_3Sn$ grains are in contact with the first substrate, and
   wherein the first bonding layer includes Ag material and the $Ag_3Sn$ gains, and the Ag material exists between the $Ag_3Sn$ grains.

2. The semiconductor device package of claim 1, wherein a content of the $Ag_3Sn$ grains in the first bonding layer is equal to or greater than about 90 wt %.

3. The semiconductor device package of claim 1, wherein the first bonding layer includes a mixture of the Ag material and the $Ag_3Sn$ grains.

4. The semiconductor device package of claim 1, wherein the first bonding layer includes a mixture of the Ag material, the $Ag_3Sn$ grains, and a solder material.

5. The semiconductor device package of claim 4, wherein a content of the solder material in the mixture is equal to or less than about 10 wt %.

6. The semiconductor device package of claim 1, wherein a content of the $Ag_3Sn$ grains in the first bonding layer is equal to or greater than about 50 wt %.

7. The semiconductor device package of claim 1, wherein the metal layer includes at least one of Al, Cu, Ni, Ag, Au, or an alloy thereof.

8. The semiconductor device package of claim 1, wherein the first substrate is one selected from among a direct bonded copper (DBC) substrate, a direct bonded aluminum (DBA) substrate, a printed circuit board (PCB), and a lead frame.

9. The semiconductor device package of claim 1, further comprising:
   a plurality of semiconductor chips including the at least one semiconductor chip.

10. The semiconductor device package of claim 1, further comprising:
    a base plate attached to the first substrate; and
    a second bonding layer provided between the base plate and the first substrate, the second bonding layer having a same configuration as the first bonding layer.

11. The semiconductor device package of claim 1, wherein the first substrate is attached to a first surface of the semiconductor chip, and the semiconductor device package further comprises,
    a second substrate attached to a second surface of the semiconductor chip, the second surface opposite to the first surface, and
    a second bonding layer provided between the second substrate and the semiconductor chip, the second bonding layer having a same configuration as the first bonding layer.

12. The semiconductor device package of claim 11, further comprising:
    at least one of a first base plate attached to the first substrate and a second base plate attached to the second substrate.

13. The semiconductor device package of claim 1, wherein the at least one semiconductor chip includes at least one power device.

14. The semiconductor device package of claim 1, wherein the first bonding layer further includes a solder material, and
    wherein a content of the solder material in the first bonding layer is equal to or less than 5 wt %.

15. The semiconductor device package of claim 1, wherein the first bonding layer covers an entirety of a facing surface of the semiconductor chip.

16. The semiconductor device package of claim 1, wherein a sum of contents of the Ag3Sn grains and the Ag material in the first bonding layer is equal to or greater than about 90 wt %.

17. The semiconductor device package of claim 1, wherein a content of Ag in the first bonding layer is at least three times a content of Sn in the first bonding layer.

* * * * *